(12) United States Patent
Lam

(10) Patent No.: US 10,256,797 B2
(45) Date of Patent: Apr. 9, 2019

(54) OSCILLATOR

(71) Applicant: Agency for Science, Technology and Research, Singapore (SG)

(72) Inventor: Yat Hei Lam, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 185 days.

(21) Appl. No.: 15/312,282

(22) PCT Filed: Jun. 2, 2015

(86) PCT No.: PCT/SG2015/050135
§ 371 (c)(1),
(2) Date: Nov. 18, 2016

(87) PCT Pub. No.: WO2015/191000
PCT Pub. Date: Dec. 17, 2015

(65) Prior Publication Data
US 2017/0104475 A1    Apr. 13, 2017

(30) Foreign Application Priority Data

Jun. 10, 2014  (SG) .......................... 10201403087 U

(51) Int. Cl.
*H03K 4/502* (2006.01)
*H03B 5/24* (2006.01)
(Continued)

(52) U.S. Cl.
CPC ............... *H03K 4/502* (2013.01); *H03B 5/24* (2013.01); *H03H 11/0422* (2013.01);
(Continued)

(58) Field of Classification Search
CPC .... H03K 11/0422; H03K 3/0377; H03K 3/02; H03K 3/011; H03K 3/0231; H03B 5/24; H03H 11/0422
(Continued)

(56) References Cited

U.S. PATENT DOCUMENTS 5,155,452 A    10/1992  Ueda et al.
6,342,817 B1 *  1/2002  Crofts ................... H03K 3/0231
                                                     331/1 R
(Continued)

OTHER PUBLICATIONS

Tokunaga et al., "An On-Chip CMOS Relaxation Oscillator with Voltage Averaging Feedback," IEEE Journal of Solid-State Circuits, vol. 45, No. 6, Jun. 2010, pp. 1150-1158.
(Continued)

*Primary Examiner* — Arnold Kinkead
(74) *Attorney, Agent, or Firm* — Winstead, P.C.

(57) ABSTRACT

According to embodiments of the present invention, an oscillator is provided. The oscillator includes a switched capacitor circuit arrangement configured to generate a predetermined voltage, a transconductance-capacitor filter configured to receive the predetermined voltage and a reference voltage, and to generate an output filter voltage based on a differential result between the predetermined voltage and the reference voltage, wherein a value of the output filter voltage is variable in response to the differential result, and a period control circuit arrangement configured to receive the output filter voltage, and further configured to generate an oscillator signal, wherein a period of the oscillator signal is variable in response to the value of the output filter voltage, wherein the oscillator is configured to control the switched capacitor circuit arrangement based on the oscillator signal to generate the predetermined voltage to be matched to the reference voltage.

16 Claims, 8 Drawing Sheets

(51) Int. Cl.
*H03K 3/0231* (2006.01)
*H03K 3/02* (2006.01)
*H03L 7/107* (2006.01)
*H03H 11/04* (2006.01)
*H03K 3/037* (2006.01)

(52) U.S. Cl.
CPC ............ *H03K 3/02* (2013.01); *H03K 3/0231* (2013.01); *H03K 3/0377* (2013.01); *H03L 7/107* (2013.01); *H03L 7/1075* (2013.01)

(58) Field of Classification Search
USPC .................. 331/111, 143, 17, 1 R, 177 R
See application file for complete search history.

(56) References Cited

U.S. PATENT DOCUMENTS

| | | | |
|---|---|---|---|
| 7,889,018 B2 * | 2/2011 | Elran | H03K 3/0231 331/111 |
| 8,120,436 B2 | 2/2012 | Park et al. | |
| 8,378,752 B2 | 2/2013 | Sako et al. | |
| 2012/0313720 A1 * | 12/2012 | Feldtkeller | H03K 3/011 331/143 |
| 2012/0319789 A1 | 12/2012 | Bhowmik et al. | |

OTHER PUBLICATIONS

Cao et al., "A 63,000 Q-Factor Relaxation Oscillator with Switched-Capacitor Integrated Error Feedback," IEEE International Solid-State Circuits Conference, Digest of Technical Papers, Feb. 2013, pp. 186-187.

Denier, Urs, "Analysis and Design of an Ultralow-Power CMOS Relaxation Oscillator," IEEE Transactions on Circuits and Systems-I: Regular Papers, vol. 57, No. 8, Aug. 2010, pp. 1973-1982.

Choe et al., "A Precision Relaxation Oscillator with a Self-Clocked Offset-Cancellation Scheme for Implantable Biomedical SoCs," IEEE International Solid-State Circuits Conference, Digest of Technical Papers, Feb. 2009, pp. 402-403.

Lee et al., "A 10 MHz 80 μW 67 ppm/°C CMOS Reference Clock Oscillator with a Temperature Compensated Feedback Loop in 0.18 μm CMOS," Symposium on VLSI Circuits, Digest of Technical Papers, Jun. 2009, pp. 226-227.

Viswanathan et al., "Switched-Capacitor Frequency Control Loop," IEEE Journal of Solid State Circuits, vol. SC-17, No. 4, Aug. 1982, pp. 775-778.

International Preliminary Report on Patentability for International Application No. PCT/SG2015/050135 dated May 18, 2016, pp. 1-16.

* cited by examiner

OSCILLATOR

CROSS-REFERENCE TO RELATED APPLICATION

This application claims the benefit of priority of Singapore patent application No. 10201403087U, filed 10 Jun. 2014, the content of it being hereby incorporated by reference in its entirety for all purposes.

TECHNICAL FIELD

Various embodiments relate to an oscillator.

BACKGROUND

Switch mode power converters, especially those featuring multi-phase operation require a high frequency on-chip clock source. A relaxation oscillator can be found frequently in switch-mode power converters (SMPC) and biomedical IC (integrated circuit) designs. It is favorable because it can be fully-integrated in a CMOS (complementary metal-oxide semiconductor) process, consumes low power and occupies a small chip area. Therefore, low cost monolithic relaxation oscillator is widely adopted.

A typical relaxation oscillator is constructed by comparators, on-chip resistors and capacitors. Other than process and temperature variations of the RC components, the non-idealities of the comparators limit the accuracy and power optimization of the relaxation oscillator.

FIG. 1A shows a schematic view of an architecture of a typical relaxation oscillator 170. The relaxation oscillator 170 consists of two identical branches A and B 172a, 172b. In each branch 172a, 172b, there are a timing capacitor $C_T=C_{TA}$ 173a=$C_{TB}$ 173b, a voltage comparator CMPA 174a, CMPB 174b and charge/discharge MOS (metal-oxide-semiconductor) switches, for example MOS transistors 175a, 176a, 175b, 176b. Using branch A 172a as an example, the transistors 175a, 176a may be electrically coupled to each other, with a source/drain terminal of the transistors 175a, 176a coupled to each other at a node where the timing capacitor $C_{TA}$ 173a and the non-inverting input (+) of the voltage comparator CMPA 174a are also connected to. The gate terminals of the transistors 175a, 176a are electrically coupled to each other to receive a voltage $V_{CLKA}$. The transistors 175b, 176b, the timing capacitor $C_{TB}$ 173b and the non-inverting input (+) of the voltage comparator CMPB 174b may be similarly connected as described above. The relaxation oscillator 170 also includes a first current source 177 supplying a current $I_{REF1}$ to the other source/drain terminal of the transistors 175a, 175b. The relaxation oscillator 170 further includes a second current source 178, supplying a current $I_{REF2}$, connected in series with a resistor $R_T$ 179 to provide a reference voltage $V_{REF}$ to the inverting inputs (−) of the voltage comparators CMPA 174a, CMPB 174b. The outputs of the voltage comparators CMPA 174a, CMPB 174b are connected to a latch circuit 180. The latch circuit 180 generates an output $V_{CLKA}$, which may be provided to the gate terminals of the transistors 175a, 176a and another output $V_{CLKB}$, which may be provided to the gate terminals of the transistors 175b, 176b.

FIG. 1B shows an operating timing diagram 190 of the relaxation oscillator 170, illustrating the capacitor voltage and clock output waveforms. Between $T_0$ and $T_2$ (between $T_2$ and $T_4$), $V_{CLKA}$ as represented by waveform 192a ($V_{CLKB}$ as represented by waveform 192b) is low, $I_{REF1}$ charges $C_{TA}$ 173a ($C_{TB}$ 173b) and therefore $V_{CTA}$ as represented by waveform 193a ($V_{CTB}$ as represented by waveform 193b) ramps up at a rate of $I_{REF1}/C_T$. At $T_1$ ($T_3$), the comparator CMPA 174a (CMPB 174b) detects the crossing of $V_{CTA}$ 193a ($V_{CTB}$ 193b) and $V_{REF}$ as represented by the dotted lines 194 (where $V_{REF}=I_{REF2} \times R_T$) and sets $V_{CLKA}$ 192a ($V_{CLKB}$ 192b) to high with a finite delay of $T_D$.

From $T_2$ to $T_4$ (from $T_4$ to $T_6$), $V_{CLKA}$ 192a ($V_{CLKB}$ 192b) is high and therefore $V_{CTA}$ 193a ($V_{CTB}$ 193b) is discharged to 0V. Preferably, the switching period of the oscillator, $T_{SW}$, depends on only the values of $C_T$ and $R_T$. However, the temperature and supply dependent comparator delay $T_D$ contribute to frequency variations of the switching frequency.

Relaxation oscillators suffer from problems where the comparator delay extends the switching period which decouples the output clock period of the oscillator from the intended RC time constant. Further, the comparators consume considerable static power such that it can toggle its output with a small delay.

Recently, average voltage feedback (AVF) has been proposed to reduce the frequency variation of a relaxation oscillator. FIG. 2A shows a simplified schematic view of an average voltage feedback (AVF) relaxation oscillator 270 of prior art, while FIG. 2B shows a timing diagram 290 of the AVF relaxation oscillator 270. The AVF relaxation oscillator 270 includes a latch circuit 280 and two identical branches A and B 272a, 272b, including the electrical elements and connections, that are similar to the relaxation oscillator 170 of FIG. 1A, except for the additional resistors 281a, 281b connected to the transistors 275a, 276a, 275b, 276b in each branch A 272a, B 272b.

The AVF relaxation oscillator 270 includes an active-RC filter, including a resistor $R_{INT}$ 281 and a capacitor $C_{INT}$ 282, with an operation amplifier 283, where $R_{INT}$ and $C_{INT}$ are time-multiplexed to extract the DC (direct current) component or average value of the capacitor voltages $V_{CTA}$ (as represented by waveform 293a), applied via a switch 284a, and $V_{CTB}$ (as represented by waveform 293b), applied via a switch 284b. The capacitor voltages $V_{CTA}$ 293a, $V_{CTB}$ 293b are alternately provided as $V_{INT}$ (as represented by waveform 295) to the resistor $R_{INT}$ 281. The resistor $R_{INT}$ 281 and the capacitor $C_{INT}$ 282 are electrically coupled to an inverting input (−) of the operation amplifier 283. The AVF relaxation oscillator 270 also includes two resistors 285, 286 which act as a potential divider to provide a reference voltage $V_{REF}$ (as represented by the solid lines 294) to a non-inverting input (+) of the operation amplifier 283. The error between the average capacitor voltage and the DC (direct-current) reference voltage $V_{REF}$ is integrated and used to adjust the threshold voltage $V_C$ (as represented by the dotted lines 296) to the comparators CMPA 274a, CMPB 274b dynamically. The negative feedback action minimizes the error in steady state and therefore the average capacitor voltage and so the capacitor voltage swing (CVS) are regulated with the presence of a finite comparator delay $T_D$.

FIG. 3 shows a schematic view of a relaxation oscillator 370 with average voltage feedback of the prior art, having a comparator and feedback amplifier design. The relaxation oscillator 370 includes one main comparator 374 arranged in an oscillator core portion 371 of the relaxation oscillator 370 and two auxiliary comparators 374a, 374b arranged in respective control logic portions 372a, 372b of the relaxation oscillator 370. A switched capacitor error integrator 387 is used in this design as part of a switched capacitor (SC) feedback portion 388 of the relaxation oscillator 370 for a smaller chip area. Chopping stabilization is also embedded in the feedback amplifier 389 of the switched capacitor error integrator 387 for lowering the flicker noise contributed by the error integrator for better noise performance. Since the design of the relaxation oscillator 370 uses three comparators 374, 374a, 374b for generating the clocks for switched-capacitor operation, its power consumption is much higher than other designs. However, its noise performance is better than the AVF relaxation oscillator 270 of FIG. 2A.

The comparators in both of the prior art designs illustrated in FIGS. 2A and 3 work like voltage controlled delay cells, which are not power efficient. The static power consumed by the comparators is much higher than the dynamic power required to switch their output from one logic level to the other.

SUMMARY

According to an embodiment, an oscillator is provided. The oscillator may include a switched capacitor circuit arrangement configured to generate a predetermined voltage, a transconductance-capacitor filter configured to receive the predetermined voltage and a reference voltage, and to generate an output filter voltage based on a differential result between the predetermined voltage and the reference voltage, wherein a value of the output filter voltage is variable in response to the differential result, and a period control circuit arrangement configured to receive the output filter voltage, and further configured to generate an oscillator signal, wherein a period of the oscillator signal is variable in response to the value of the output filter voltage, wherein the oscillator is configured to control the switched capacitor circuit arrangement based on the oscillator signal to generate the predetermined voltage to be matched to the reference voltage.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 1A shows a schematic view of a relaxation oscillator, while

FIG. 2A shows a schematic view of an average voltage feedback (AVF) relaxation oscillator of prior art, while

FIG. 5A shows a schematic view of an oscillator, while

FIG. 6A shows a schematic view of a current controlled delay cell (CCDC), while

DETAILED DESCRIPTION

Figure 1A:
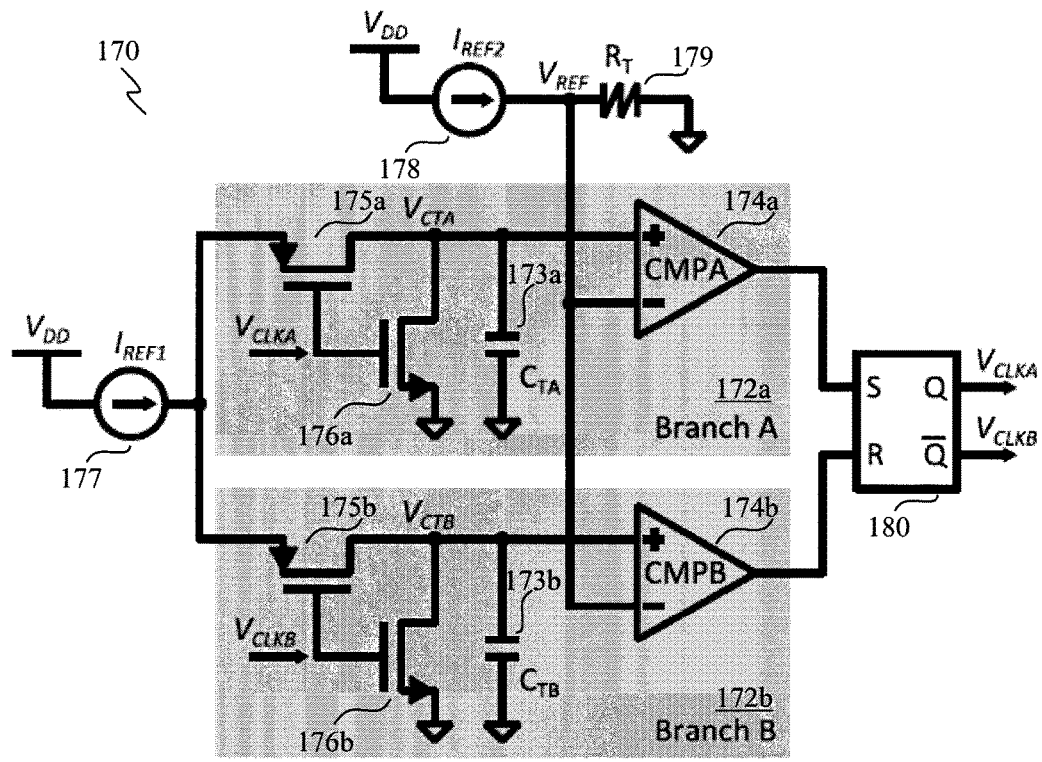
Figure 1B:
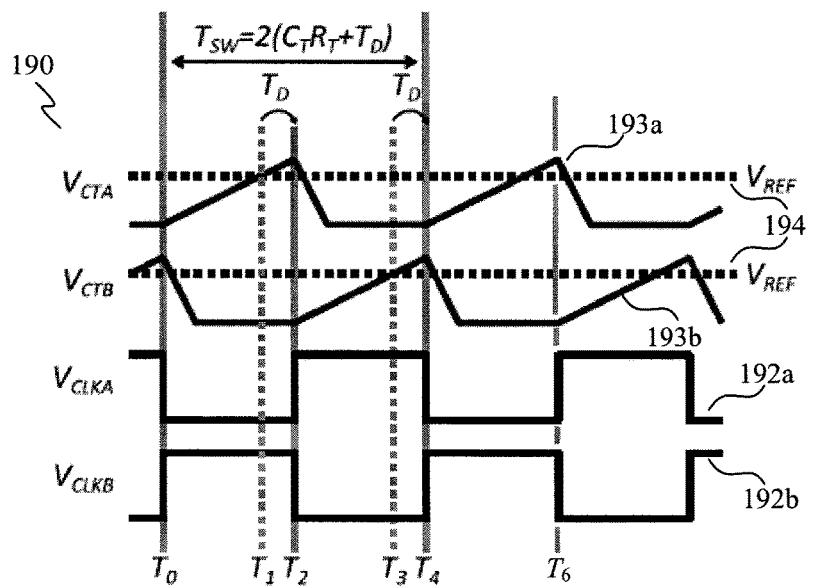
FIG. 1B shows an operating timing diagram of the relaxation oscillator of FIG. 1A.
Figure 2A:
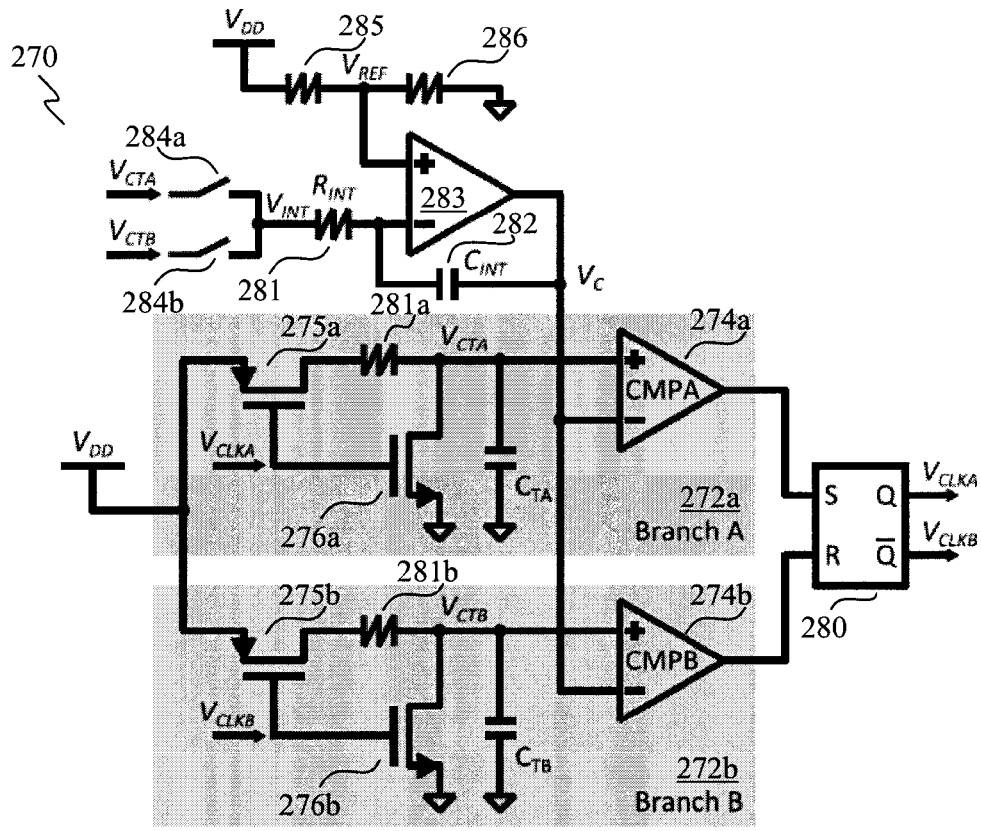
Figure 2B:
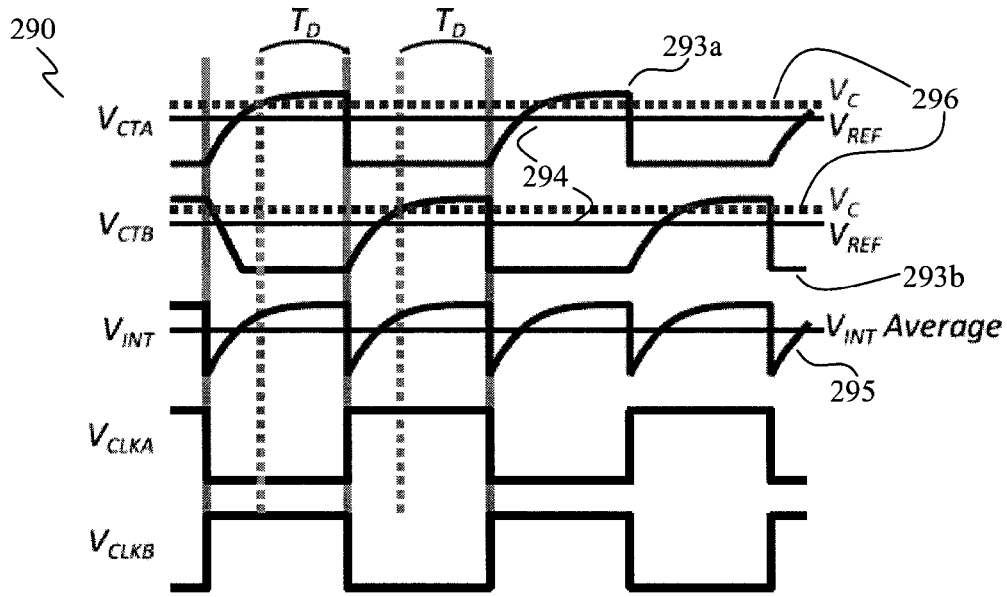
FIG. 2B shows a timing diagram of the AVF relaxation oscillator of FIG. 2A.
Figure 3:
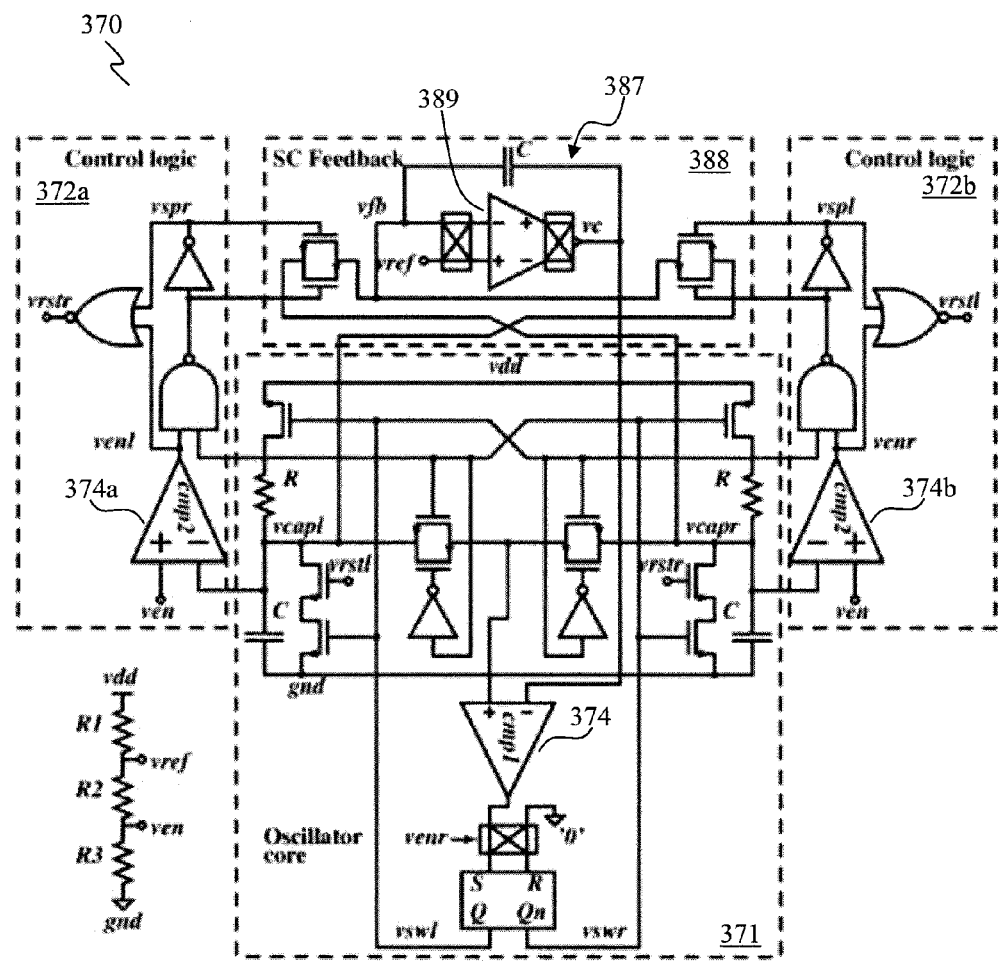
FIG. 3 shows a schematic view of a relaxation oscillator with average voltage feedback of prior art.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide a low power relaxation oscillator with current mode delay cell (or current controlled delay cell).

In the relaxation oscillators of the prior art, the comparators work like voltage controlled delay cells, which is not power efficient. The static power consumed by the comparators is much higher than the dynamic power required to switch their output from one logic level to the other. In contrast, various embodiments may provide a low-power relaxation oscillator with a current controlled delay cell (CCDC). The CCDC may be embedded in the capacitor voltage swing (CVS) regulation loop such that the oscillator frequency may be stabilized with low sensitivity to the supply voltage variation.

Various embodiments may provide a 32.5 MHz low power, supply insensitive monolithic CMOS (complementary metal-oxide semiconductor) relaxation oscillator.

Instead of using voltage-mode comparators for cycle-by-cycle capacitor voltage swing (CVS) threshold voltage comparison, the CVS in various embodiments is regulated by a low-power CVS regulation feedback loop which may include or consist of a current-controlled delay cell (CCDC)

and a gm-C(transconductance-capacitance, or transconductance-capacitor) CVS error integrator. The CCDC and all switching logics may be powered by a CMOS threshold-voltage referenced regulated supply voltage for reducing switching-losses and supply-induced delay variations. The oscillator may consume about 16.6 µW from a 1.5 V supply voltage at room temperature, achieving a figure of merit (FOM) of about 0.51 µW/MHz. The measured output frequency variation may be approximately <±0.13%/V at approximately 32.75 MHz, for a supply range of about 1.5 V to about 3.6 V. The oscillator may occupy approximately 0.0132 mm² in a 0.18 µm CMOS process.

Various embodiments may include one or more of the following: (1) the use of a gm-C(transconductance-capacitance) filter to integrate the error between the capacitor voltage swing magnitude and the reference voltage; (2) the use of the integrated error signal from the gm-C filter to control the delay or timing of the capacitor charge period through a current programmable delay cell; (3) the application of a low static power, current programming delay cell (e.g., a current controlled delay cell (CCDC)) in the capacitor voltage swinging regulation loop for oscillator output frequency regulation; or (4) the application of a CMOS threshold voltage referenced on-chip supply for powering the CCDC and all the major logic cells for the purpose of low power consumption and supply insensitive operation.

In various embodiments, the current controlled delay cell (CCDC) may consume no static current, which is much more energy efficient than those prior art relaxation oscillators with comparators. The SC gm-C(switched capacitor transconductance-capacitance) error integrator with grounded capacitors in various embodiments may allow area and cost efficient MOSCAP (MOS capacitor; metal-oxide semiconductor capacitor) as integration capacitor(s).

Various embodiments may provide one or more approaches to identify the most power consuming building blocks in the system which is the voltage comparator for comparing the capacitor voltages with the reference voltage, and/or to review the operation of the relaxation oscillator and come up with a strategy to eliminate the use of the energy inefficient voltage comparator, and/or to identify the parameters that are more critical for power management applications which are the area (of the oscillator) and power (consumption). The design of various embodiments may be optimized towards the two critical parameters.

Figure 4:
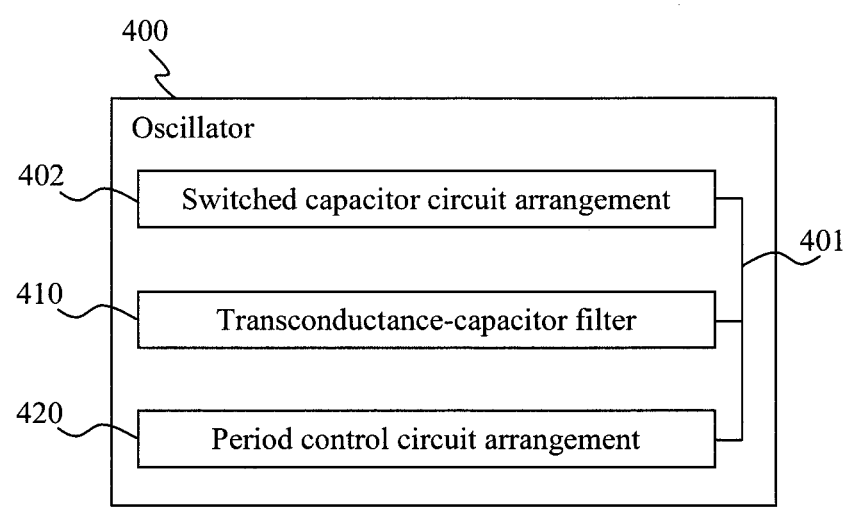
FIG. 4 shows a schematic cross-sectional view of an oscillator, according to various embodiments.

FIG. 4 shows a schematic cross-sectional view of an oscillator 400, according to various embodiments. The oscillator 400 includes a switched capacitor circuit arrangement 402 configured to generate a predetermined voltage, a transconductance-capacitor filter 410 configured to receive the predetermined voltage and a reference voltage, and to generate an output filter voltage based on a differential result between the predetermined voltage and the reference voltage, wherein a value of the output filter voltage is variable in response to the differential result, and a period control circuit arrangement 420 configured to receive the output filter voltage, and further configured to generate an oscillator signal, wherein a period of the oscillator signal is variable in response to the value of the output filter voltage, wherein the oscillator 400 is configured to control the switched capacitor circuit arrangement 402 based on the oscillator signal to generate the predetermined voltage to be matched to the reference voltage. The line represented as 401 illustrates the coupling among the switched capacitor circuit arrangement 402, the transconductance-capacitor filter 410 and the period control circuit arrangement 420, which may include electrical coupling and/or mechanical coupling.

In other words, the oscillator 400 may include a transconductance-capacitor (gm-C) filter 410, and a switched capacitor circuit arrangement 402 which may supply a predetermined voltage (e.g., $V_{PEAK}$) to the transconductance-capacitor filter (or gm-C filter) 410, e.g., to one input of the gm-C filter 410. The gm-C filter 410 may be electrically coupled to the switched capacitor circuit arrangement 402. The gm-C filter 410 may be directly connected to the switched capacitor circuit arrangement 402. The gm-C filter 410 may also receive a reference voltage (e.g., $V_{REF}$), for example, at another input of the gm-C filter 410. The gm-C filter 410 may compare the predetermined voltage to the reference voltage, and based on the comparison, resulting in a differential result, the gm-C filter 410 may generate an output filter voltage (e.g., $V_C$). The value of the output filter voltage may depend on the differential result, and therefore may be changed corresponding to the differential result obtained. The output filter voltage may be an analog voltage or signal.

In various embodiments, when the differential result between the predetermined voltage (or its associated value) and the reference voltage (or its associated value) is non-zero, there is an error between the predetermined voltage and the reference voltage. The gm-C filter 410 may act as an error integrator, where the output filter voltage may represent the average error between the predetermined voltage and the reference voltage. This may mean that the gm-C filter 410 may integrate the error between the predetermined voltage and the reference voltage.

In various embodiments, based on the differential result between the predetermined voltage (or its associated value) and the reference voltage (or its associated value), the output filter voltage may have a respective or predetermined value. For example, where the predetermined voltage is lower (or less) than the reference voltage such that the differential result is non-zero (e.g., a negative differential result), the output filter voltage may have a value that is lower (or less) as compared to a value of the output filter voltage when the differential result is zero. Further, where the predetermined voltage is higher (or more) than the reference voltage such that the differential result is non-zero (e.g., a positive differential result), the output filter voltage may have a value that is higher (or more) as compared to a value of the output filter voltage when the differential result is zero.

The oscillator 400 may include a period control circuit arrangement 420 which may receive the output filter voltage provided by the gm-C filter 410. The period control circuit arrangement 420 may be electrically coupled to the gm-C filter 410. The period control circuit arrangement 420 may be directly connected to the gm-C filter 410. The period control circuit arrangement 420 may be coupled to the output of the gm-C filter 410. The period control circuit arrangement 420 may provide an oscillator signal (e.g., $V_{CLKOUT}$) as an output in response to the output filter voltage. The period of the oscillator signal may depend on the value of the output filter voltage, and therefore may be changed corresponding to the value of the output filter voltage generated. In various embodiments, the oscillator signal may be a periodic signal.

In various embodiments, the gm-C filter 410 may be connected to the switched capacitor circuit arrangement 402 and the period control circuit arrangement 420, in between the switched capacitor circuit arrangement 402 and the period control circuit arrangement 420.

In various embodiments, the oscillator 400 may further control the switched capacitor circuit arrangement 402 based on the oscillator signal generated by the period control circuit arrangement 420 so as to generate the predetermined voltage to be matched to the reference voltage.

Depending on the value of the output filter voltage, the period of the oscillator signal be maintained or may be correspondingly changed. For example, where the differential result between the predetermined voltage and the reference voltage is non-zero, the period of the oscillator signal may be correspondingly changed (e.g., increased or decreased) so that the switched capacitor circuit arrangement 402 may be controlled based on the oscillator signal such that the predetermined voltage may be at least substantially matched to the reference voltage, and consequently a zero differential result may be achieved.

As non-limiting examples, the switched capacitor circuit arrangement 402 may include at least one capacitor, wherein the switched capacitor circuit arrangement 402 may be configured to control charging of the at least one capacitor (e.g., the charging time) to generate the predetermined voltage. In various embodiments, at least one of charging or discharging of the at least one capacitor (e.g., the charging time and/or discharging time) of the switched capacitor circuit arrangement 402 may be controlled based on the oscillator signal.

In various embodiments, a delay or timing (e.g., duration) of the charging period of at least one capacitor of the switched capacitor circuit arrangement 402 may be controlled based on the oscillator signal so that the predetermined voltage that may be generated may be matched to the reference voltage. In various embodiments, the output filter voltage generated by the gm-C filter 410 may be used to control the switched capacitor circuit arrangement 402, for example, to control a delay or timing (e.g., duration) of the charging period of the at least one capacitor of the switched capacitor circuit arrangement 402 through the period control circuit arrangement 420.

In the context of various embodiments, the period control circuit arrangement 420 may act as a switching period control element for the switched capacitor circuit arrangement 402, for example, for controlling at least one of charging or discharging of at least one capacitor of the switched capacitor circuit arrangement 402.

In the context of various embodiments, the period control circuit arrangement 420 may be a delay circuit or a delay cell, for example, a current controlled delay cell (CCDC).

The oscillator 400 may further include a feedback path (electrical feedback path) connected to the period control circuit arrangement 420 and the switched capacitor circuit arrangement 402, wherein the oscillator 400 may be configured to feed back, through the feedback path, the oscillator signal for controlling the switched capacitor circuit arrangement 402 to generate the predetermined voltage to be matched to the reference voltage.

The oscillator 400 may further include a pulse generating circuit (e.g., a "logic and pulse gen" circuit) in the feedback path, wherein the pulse generating circuit may be configured to receive the oscillator signal that is fed back and further configured to generate at least one control signal (e.g., $V_{CLKA}$, $V_{CLKB}$, $V_{CLKSA}$, etc.) based on the oscillator signal for controlling the switched capacitor circuit arrangement 402 to generate the predetermined voltage to be matched to the reference voltage. This may mean that the at least one control signal (generated or derived based on the fed back oscillator signal) may be used to control the switched capacitor circuit arrangement 402, for example, to control at least one of charging or discharging (e.g., the charging time and/or discharging time) of at least one capacitor of the switched capacitor circuit arrangement 402. The pulse generating circuit may include at least one logic element.

In various embodiments, the switched capacitor circuit arrangement 402 may include two capacitor circuit branches configured to alternately generate the predetermined voltage to be received by the gm-C filter 410, wherein each capacitor circuit branch may include a timing capacitor (e.g., $C_T$) for generating the predetermined voltage. The two circuit branches may be connected in parallel to each other. Each timing capacitor may be a grounded capacitor.

In various embodiments, each capacitor circuit branch may further include a first switch and a second switch, wherein the timing capacitor may be connected in between the first switch and the second switch, wherein the first switch may be adapted for controlling charging of the timing capacitor for generating the predetermined voltage, and wherein the second switch may be adapted for controlling supply of the predetermined voltage that is generated to the gm-C filter 410. Each capacitor circuit branch may further include a third switch adapted for controlling discharging of the timing capacitor.

Each of the first switch, second switch and third switch of each of the two capacitor circuit branches may receive respective control signals generated based on the oscillator signal, e.g., control signals generated by the pulse generating circuit.

In various embodiments, the switched capacitor circuit arrangement 402 may include a storing capacitor to store the predetermined voltage to be received by the gm-C filter 410. The storing capacitor may be connected to an input of the gm-C filter 410. The storing capacitor may be connected in between the second switch of each capacitor circuit branch and the gm-C filter 410. The storing capacitor may be a grounded capacitor.

In various embodiments, the oscillator 400 may further include a current source configured to supply a current to the switched capacitor circuit arrangement 402 for generating the predetermined voltage. The current source may be electrically coupled to the switched capacitor circuit arrangement 402. The current source may be directly connected to the switched capacitor circuit arrangement 402. The current source may be connected to between a power supply voltage (e.g., $V_{DD}$) and the switched capacitor circuit arrangement 402.

In various embodiments, the gm-C filter 410 may include a transconductance amplifier (gm) configured to receive the predetermined voltage and the reference voltage and further configured to provide an output filter current based on the differential result between the predetermined voltage and the reference voltage, and an output capacitor connected to an output of the transconductance amplifier, the output capacitor configured to receive the output filter current and to generate the output filter voltage from the output filter current received by the output capacitor. The output filter current may cause charging of the output capacitor to generate the output filter voltage.

The transconductance amplifier of the gm-C filter 410 may include one input (e.g., non-inverting input) connected to the switched capacitor circuit arrangement 402 to receive the predetermined voltage, and another input (e.g., inverting input) connected to a reference circuit to receive the reference voltage. The storing capacitor of the switched capacitor circuit arrangement 402 may be connected to the one input (e.g., non-inverting input) of the transconductance amplifier. The output capacitor may be connected to an output of the transconductance amplifier. The output capacitor may also be connected to the period control circuit arrangement 420, for example, connected to an input of the period control circuit arrangement 420. The output capacitor may be a grounded capacitor.

In various embodiments, the period control circuit arrangement 420 may include a current mirror circuit having a first current branch and a second current branch, a switching element arrangement electrically coupled to the current mirror circuit, a delay capacitor (e.g., $C_P$) connected to the second current branch of the current mirror circuit, wherein the switching element arrangement may be configured to control current flow through the current mirror circuit for charging and discharging of the delay capacitor, and a Schmitt trigger connected to the delay capacitor, the Schmitt trigger configured to generate the oscillator signal based on a voltage state of the delay capacitor in response to the charging and the discharging of the delay capacitor. The Schmitt trigger may be connected to the second branch of the current mirror circuit. The delay capacitor may be a grounded capacitor.

In various embodiments, the current mirror circuit of the period control circuit arrangement 420 may include a transistor (e.g., transistors $M_{P1}$, $M_{P2}$, FIG. 6A) in each of the first current branch and the second current branch. Each of the respective transistors in the first current branch and the second current branch may be a PMOS transistor (p-channel metal-oxide-semiconductor field-effect transistor, p-channel MOSFET). The first current branch and the second current branch are parallel current branches.

In various embodiments, the switching element arrangement may include a first transistor (e.g., transistor $W_{N1}$, FIG. 6A) and a first switch (e.g., $S_1$, FIG. 6A) connected in series, and coupled to the first current branch of the current mirror circuit, and a second transistor (e.g., transistor $M_{N2}$, FIG. 6A) and a second switch (e.g., $S_2$, FIG. 6A) connected in series, and coupled to the second current branch of the current mirror circuit, wherein respective gate terminals of the first transistor and the second transistor may be connected to each other to receive the output filter voltage, and wherein the period control circuit arrangement 420 may be configured to generate respective control signals based on the oscillator signal to alternately activate the first switch and the second switch. Each of the first transistor and the second transistor of the switching element arrangement may be an NMOS transistor (n-channel metal-oxide-semiconductor field-effect transistor, n-channel MOSFET). In various embodiments, the first switch and the second switch may not be simultaneously activated. In various embodiments, the term "activate" as applied to an electrical element means to "turn on" or "close" the electrical element to allow a current flow through the electrical element, meaning providing an electrical path through the electrical element.

In various embodiments, the period control circuit arrangement 420 may further include a logic arrangement (e.g., a "deadtime logic" circuit) configured to generate the respective control signals, based on the oscillator signal, for alternately activating the first switch and the second switch.

In various embodiments, the oscillator 400 may further include a voltage generator configured to provide a regulated supply voltage (e.g., $V_{DIG}$) to the period control circuit arrangement 420. For example, the current mirror circuit of the period control circuit arrangement 420 may be connected to the regulated supply voltage. The regulated supply voltage may also be provided to the pulse generating circuit.

In various embodiments, the voltage generator may include a voltage follower circuit connected to a power supply voltage (e.g., $V_{DD}$), the voltage follower circuit having a first voltage branch and a second voltage branch, a first transistor (e.g., transistor MP1, FIG. 7) and a second transistor (e.g., transistor MN3, FIG. 7) connected in series with each other and further connected between a first node of the first voltage branch and ground, wherein respective gate terminals of the first transistor and the second transistor may be connected to each other and further connected to a connection node between the first transistor and the second transistor, a third transistor (e.g., transistor MP2, FIG. 7) and a fourth transistor (e.g., transistor MN4, FIG. 7) connected in series with each other and further connected between a second node of the second voltage branch and ground, wherein respective gate terminals of the third transistor and the fourth transistor may be connected to each other and further connected to a connection node between the third transistor and the fourth transistor, wherein the voltage generator may be configured to generate a threshold voltage (e.g., $V_{THREF}$) at the first node, and to supply the threshold voltage to the second node through the voltage follower circuit, the threshold voltage being at least substantially equal to a voltage sum of the absolute threshold voltages of the first transistor and the second transistor, and wherein the voltage generator may be configured to provide the threshold voltage as the regulated supply voltage (e.g., $V_{DIG}$) at an output of the voltage generator. The output of the voltage generator may be connected to the second node. The first voltage branch and the second voltage branch are parallel voltage branches.

In various embodiments, each of the first transistor and the third transistor of the voltage generator may be a PMOS transistor. Each of the second transistor and the fourth transistor of the voltage generator may be an NMOS transistor. The first transistor and the third transistor may be directly connected to the voltage follower circuit.

In various embodiments, the voltage follower circuit may include a transistor (e.g., transistors MN1, MN2, FIG. 7) in each of the first voltage branch and the second voltage branch. Each of the respective transistors in the first voltage branch and the second voltage branch may be an NMOS transistor.

In the context of various embodiments, the term "threshold voltage" as applied to a field-effect transistor (FET) may mean the minimum gate-to-source voltage differential that may be needed to create a conducting path between the source and drain terminals of the FET.

In various embodiments, the voltage generator may further include an error amplifier (EA) having a first input (e.g., an inverting input) connected to the first node, and a second input (e.g., a non-inverting input) connected to the second node, and a feedback transistor (e.g., transistor MP3, FIG. 7) connected between the power supply voltage (e.g., $V_{DD}$) and the output of the voltage generator, wherein a gate terminal of the feedback transistor may be connected to an output of the error amplifier. The feedback transistor may be a PMOS transistor.

In various embodiments, the oscillator 400 may further include a reference circuit having a current source, the reference circuit configured to generate the reference voltage (e.g. $V_{REF}$) based on a current supplied by the current source. The reference circuit may include a resistor connected in series with the current source. The reference circuit may be connected to a power supply voltage (e.g., $V_{DD}$).

In the context of various embodiments, the oscillator 400 may include or may be a relaxation oscillation. A relaxation oscillator may mean an oscillator that may produce an non-sinusoidal oscillator signal, for example, a periodic triangular wave oscillator signal or a periodic square wave oscillator signal. This may mean that the oscillator 400 may be a non-linear oscillator.

In the context of various embodiments, the oscillator 400 may be free of a voltage comparator that outputs (directly) an output voltage or a digital signal (output digital signal). A "conventional" voltage comparator typically provides digital values (low or high) as its output according to the comparison carried out by the "conventional" voltage comparator. Therefore, the "conventional" voltage comparator is unable to provide any (analog) voltage values, for example, a voltage that is lower than a power supply voltage or in the middle of the power supply voltage. A "conventional" voltage comparator works like a voltage controlled delay cell. In contrast, in various embodiments, the oscillator 400 may include a period control circuit arrangement 420 (e.g., a current controlled delay cell (CCDC)) instead of "conventional" voltage comparators used in conventional relaxation oscillators.

In the context of various embodiments, the term "coupled" may include electrical coupling and/or mechanical coupling.

In the context of various embodiments, the term "coupled" with regard to two or more components may include direct coupling and/or indirect coupling. For example, two components being coupled to each other may mean that there is a direct coupling path between the two components and/or there is an indirect coupling path between the two components, e.g. via one or more intervening components connected therebetween.

In the context of various embodiments, the term "grounded capacitor" may mean that one terminal or end of the capacitor is grounded, i.e., connected to ground.

In the context of various embodiments, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a 'circuit' in accordance with an alternative embodiment.

In the context of various embodiments, the term "source/drain terminal" of a transistor may refer to a source terminal or a drain terminal. As the source terminal and the drain terminal of a transistor are generally fabricated such that these terminals are geometrically symmetrical, these terminals may be collectively referred to as source/drain terminals. In various embodiments, a particular source/drain terminal may be a "source" terminal or a "drain" terminal depending on the voltage to be applied to that terminal. Accordingly, the terms "first source/drain terminal" and "second source/drain terminal" may be interchangeable.

In various embodiments, as non-limiting examples, for a switch-mode power converter (SMPC) design, the power consumption of the oscillator and its output accuracy with respect to RC values may be much more critical than its noise performance. In addition, a high frequency (>10 MHz) clock output may be required for high power density SMPC. The oscillator (e.g., a relaxation oscillator) of various embodiments may be designed, taking into consideration the above requirements.

Figure 5A:
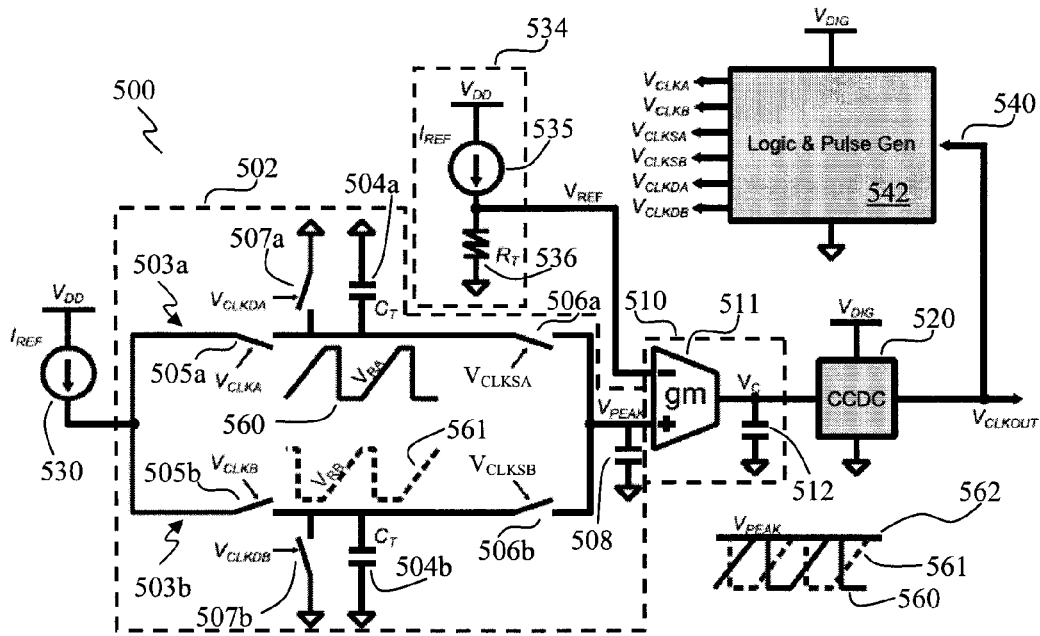
Figure 5B:
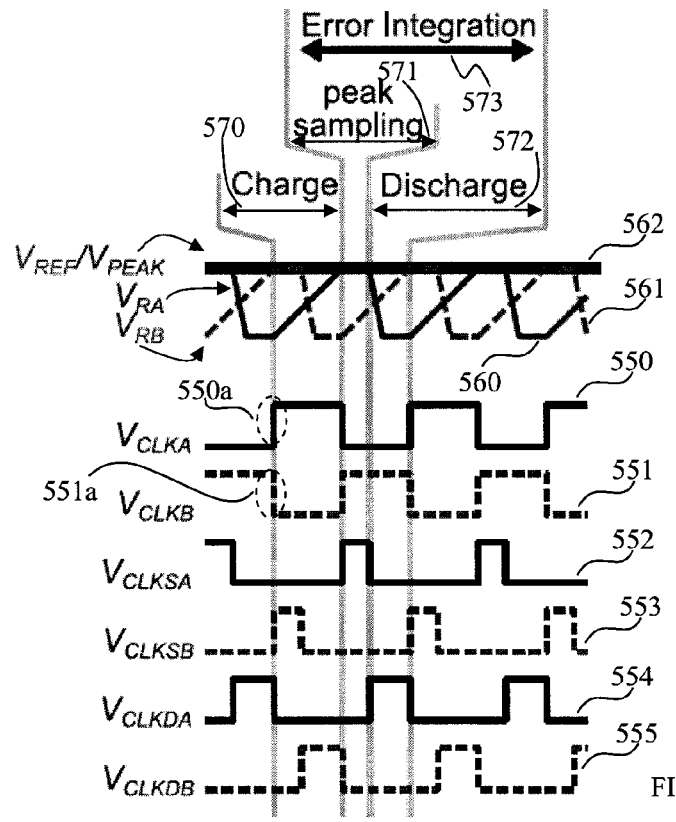
FIG. 5B shows the corresponding voltage waveforms, according to various embodiments.

FIG. 5A shows a schematic view of an oscillator 500, according to various embodiments, illustrating a design of a (low-power) relaxation oscillator with a current-controlled delay cell (CCDC), while FIG. 5B shows the corresponding critical voltage waveforms for the oscillator 500.

The oscillator 500 may include a switched capacitor circuit arrangement 502, a transconductance-capacitor (gm-C) filter 510 and a period control circuit arrangement (e.g., current controlled delay cell, CCDC) 520 connected to each other. The gm-C filter 510 may be coupled in between the switched capacitor circuit arrangement 502 and the CCDC 520.

The switched capacitor circuit arrangement 502 may include two capacitor circuit branches 503a, 503b. The two capacitor circuit branches 503a, 503b may be connected to each other in parallel. Each capacitor circuit branch 503a, 503b may include a timing capacitor, $C_T$, 504a, 504b, which may be connected between two switches, e.g., a first switch 505a, 505b, and a second switch 506a, 506b. This may mean that a first end of the respective timing capacitor ($C_T$) 504a, 504b may be connected to the respective first switch 505a, 505b, and the respective second switch 506a, 506b at a respective node. The second (opposite) end of the respective timing capacitor, $C_T$, 504a, 504b may be grounded. Therefore, each timing capacitor, $C_T$, 504a, 504b may be a grounded capacitor.

Each capacitor circuit branch 503a, 503b may further include a third switch 507a, 507b. The respective third switch 507a, 507b may be connected to the first end of the respective timing capacitor, $C_T$, 504a, 504b. The respective third switch 507a, 507b may also be connected to the respective first switch 505a, 505b.

The switched capacitor circuit arrangement 502 may further include a storing capacitor 508 at an output end of the switched capacitor circuit arrangement 502. Each capacitor circuit branch 503a, 503b may be connected to the storing capacitor 508. The storing capacitor 508 may be a grounded capacitor.

An input end of the switched capacitor circuit arrangement 502 may be connected to a current source 530 which may supply a current, $I_{REF}$, to the timing capacitors, $C_T$, 504a, 504b. The current source 530 may be connected to a power supply voltage, $V_{DD}$.

The gm-C filter 510 may include a transconductance (gm) amplifier 511 and an output capacitor 512 connected to an output terminal of the transconductance amplifier 511. The node where the output terminal of the transconductance amplifier 511 and the output capacitor 512 are connected to each other may form the output of the gm-C filter 510. The output capacitor 512 may be a grounded capacitor. The gm-C filter 510 may provide an output voltage, $V_C$, which may be stored at the output capacitor 512.

The transconductance amplifier 511 may include two input terminals, for example, an inverting input (−) terminal and a non-inverting input (+) terminal. The non-inverting input (+) terminal may be connected to the output of the switched capacitor circuit arrangement 502, for example, connected to the storing capacitor 508.

The oscillator 500 may further include a reference circuit 534. The reference circuit 534 may include a current source 535 and a resistor, $R_T$, 536 connected to each other in series, and connected in between a power supply voltage, $V_{DD}$, and ground. A connection may be provided from a node located between the current source 535 and the resistor, $R_T$, 536 to the inverting input (−) terminal of the transconductance amplifier 511 so that the reference circuit 534 may provide a reference voltage, $V_{REF}$, to the inverting input (−) terminal of the transconductance amplifier 511.

The CCDC 520 may be connected to the output of the gm-C filter 510. This may mean that an input terminal of the CCDC 520 may be connected to the output node of the gm-C filter 510. The CCDC 520 may be connected to a supply voltage (e.g., a regulated supply voltage), $V_{DIG}$. The CCDC 520 may supply an oscillator signal, $V_{CLKOUT}$, at its output, as an output signal.

The oscillator 500 may include a feedback path 540 arranged between the CCDC 520 and the switched capacitor circuit arrangement 502. The electrical feedback path 540 may feed back the oscillator signal, $V_{CLKOUT}$, generated by the CCDC 520 in a feedback direction from the CCDC 520 towards the switched capacitor circuit arrangement 502.

The oscillator 500 may further include a pulse generating circuit (represented as a "Logic and Pulse Gen" block) 542 in the feedback path 540. The pulse generating circuit 542 may be connected to the output of the CCDC 520 to receive the oscillator signal, $V_{CLKOUT}$, as an input signal. This may mean that an input terminal of the pulse generating circuit 542 may be connected to the output of the CCDC 520. The pulse generating circuit 542 may be connected to a supply voltage (e.g., a regulated supply voltage), $V_{DIG}$, which may be the same supply voltage provided to the CCDC 520. The pulse generating circuit 542 may include an arrangement of logic elements (not shown).

The pulse generating circuit 542 may generate at least one control signal based on the oscillator signal, $V_{CLKOUT}$, for example, by means of the arrangement of logic elements in the pulse generating circuit 542. As non-limiting examples, the pulse generating circuit 542 may generate, based on the oscillator signal, $V_{CLKOUT}$, a plurality of control signals (e.g., $V_{CLKA}$, $V_{CLKB}$, $V_{CLKSA}$, $V_{CLKSB}$, $V_{CLKDA}$, $V_{CLKDSB}$) as output signals. The plurality of control signals may be used to control operation of the respective switches 505a, 505b, 506a, 506b, 507a, 507b of the switched capacitor circuit arrangement 502. For example, for the first capacitor circuit branch 503a, the first switch 505a may be operated by or activated in response to the control signal, $V_{CLKA}$, the second switch 506a may be operated by or activated in response to the control signal, $V_{CLKSA}$, and the third switch 507a may be operated by or activated in response to the control signal, $V_{CLKDA}$, while for the second capacitor circuit branch 503b, the first switch 505b may be operated by or activated in response to the control signal, $V_{CLKB}$, the second switch 506b may be operated by or activated in response to the control signal, $V_{CLKSB}$, and the third switch 507b may be operated by or activated in response to the control signal, $V_{CLKDB}$.

Operation of the oscillator 500 will now be described by way of the following non-limiting example, with reference to FIGS. 5A and 5B. FIG. 5B shows the corresponding voltage waveforms for the plurality of control signals.

Consider a clock period starting at the rising edge 550a of signal $V_{CLKA}$ 550, where signal $V_{CLKA}$ 550 changes to high. As a result, the first switch 505a is closed, and the current $I_{REF}$ from the current source 530 may flow through the first switch 505a to the timing capacitor 504a. At the same time, signal $V_{CLKB}$ 551 has a falling edge 551a and signal $V_{CLKB}$ 551 changes to low. The first switch 505b is open, preventing current flow through the second capacitor circuit branch 503b. Signals $V_{CLKA}$ 550 and $V_{CLKB}$ 551 may be opposite to each other, meaning that while one signal is high, the other signal is low.

Subsequently, the capacitor voltage $V_{RA}$ 560 of the timing capacitor 504a charges from 0V at a rate of $I_{REF}/C_T$ in the charge phase 570. The charge duration (during the charging phase 570) may be timed by the CCDC 520 with its timing controlled by a control voltage, $V_C$, generated by the gm-C filter 510.

When the charge phase 570 expires, by means of the feedback path 540 and the pulse generating circuit 542, signal $V_{CLKA}$ 550 may be reset by the CCDC 520, and the CCDC 520 may trigger a short pulse for signal $V_{CLKSA}$ 552 (which, as a result, the second switch 506a is closed) to sample and store the peak of $V_{RA}$ 560 at the storing capacitor 508 as $V_{PEAK}$ 562. This may be carried out during a peak sampling phase 571. At the same time, the charge phase of $V_{RB}$ 561 may be started, with signal $V_{CLKB}$ 551 in a high state, such that the first switch 505b is in a closed position, and the current $I_{REF}$ from the current source 530 may flow through the first switch 505b to the timing capacitor 504b. Before $V_{RB}$ 561 reaches its peak, $V_{RA}$ 560 is discharged to ground by asserting signal $V_{CLKDA}$ 554 during a discharge phase 572. In this way, as signal $V_{CLKDA}$ 554 is high, the third switch 507a may be activated to be in a closed position to provide an electrical path between the timing capacitor 504a and ground. Similar operation, e.g., charging and discharging, of the timing capacitor 504b may be performed based on the signals $V_{CLKB}$ 551, $V_{CLKSB}$ 553 and $V_{CLKDB}$ 555.

The peak voltages of $V_{RA}$ 560 and $V_{RB}$ 561, which are stored as $V_{PEAK}$ at the storing capacitor 508, may be compared with the reference voltage, $V_{REF}$, by the gm-C filter 510. The output, $V_C$, of the gm-C filter 510 represents the average error between $V_{PEAK}$ and $V_{REF}$. As examples, the transconductance amplifier 511 may compare $V_{PEAK}$ received at its non-inverting input (+) terminal with $V_{REF}$ received at its inverting input (−) terminal, and based on the differential result between $V_{PEAK}$ and the $V_{REF}$, may provide a current (or output filter current) at the output of the transconductance amplifier 511. The current generated by the transconductance amplifier 511 may be received by the output capacitor 512 for charging the output capacitor 512. As a result, the output capacitor 512 may generate the output filter voltage $V_C$. The error integration operation with regard to $V_{RA}$ 560 may be performed during the error integration phase 573.

If $V_{PEAK}$ is lower (or higher) than $V_{REF}$, the oscillator 500 is running too fast (or slow), and as a result, $V_C$ is reduced (or increased) by the gm-C filter 510 to extend (or shorten) the delay in the CCDC 520. This negative feedback action drives $V_{PEAK}$ to match $V_{REF}$ that may lead to successful capacitor voltage swing (CVS) regulation for stable output frequency (for the oscillator signal, $V_{CLKOUT}$).

Prior art oscillators employ an active-RC filter in a negative feedback loop which requires an on-chip capacitor with two floating terminals. In contrast, the gm-C filter 510 in the oscillator 500 of various embodiments requires only a grounded capacitor 512 which may be implemented by a low-cost and area efficient MOS capacitor.

Figure 6A:
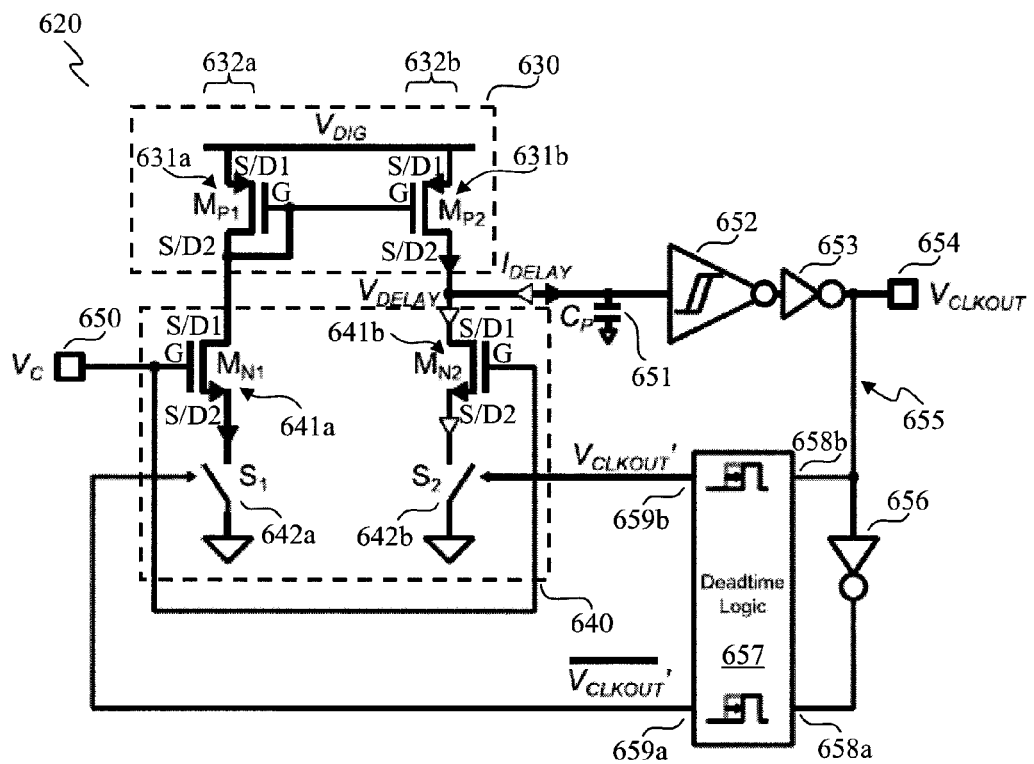
Figure 6B:
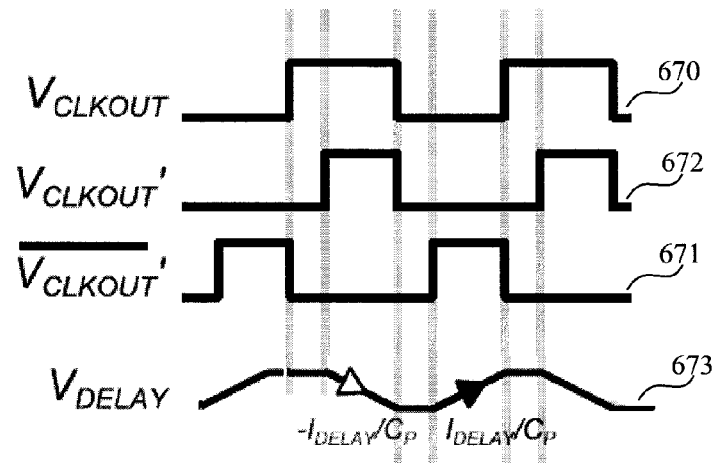
FIG. 6B shows the corresponding voltage waveforms, according to various embodiments.

FIG. 6A shows a schematic view of a current controlled delay cell (CCDC) 620 design, according to various embodiments, while FIG. 6B shows the corresponding critical voltage waveforms for the CCDC 620. The design of the CCDC 620 illustrated in FIG. 6A may contribute to significant power saving.

The CCDC 620 may include a current mirror circuit 630 having a pair of transistors (e.g., PMOS transistors) $M_{P1}$ 631a and $M_{P2}$ 631b. The transistor $M_{P1}$ 631a may be arranged in a first current branch 632a of the current mirror circuit 630, while the transistor $M_{P2}$ 631b may be arranged in a second current branch 632b of the current mirror circuit 630. The transistors $M_{P1}$ 631a, $M_{P2}$ 631b may be connected to a supply voltage (e.g., a regulated supply voltage), $V_{DIG}$. For example, respective first source/drain (S/D1) terminals of the transistors $M_{P1}$ 631a, $M_{P2}$ 631b may be connected to $V_{DIG}$. Respective gate (G) terminals of the transistors $M_{P1}$ 631a, $M_{P2}$ 631b may be connected to each other. The gate (G) terminal of the transistor $M_{P1}$ 631a may be connected to a second source/drain (S/D2) terminal of the transistor $M_{P1}$ 631a.

The CCDC 620 may further include a switching element arrangement 640 connected or electrically coupled to the current mirror circuit 630. The switching element arrangement 640 may include a first transistor (e.g., an NMOS transistor) $M_{N1}$ 641a and a first switch $S_1$ 642a connected to each other in series. The first transistor $M_{N1}$ 641a and the first switch $S_1$ 642a may be coupled to the first current branch 632a. The switching element arrangement 640 may further include a second transistor (e.g., an NMOS transistor) $M_{N2}$ 641b and a second switch $S_2$ 642b connected to each other in series. The second transistor $M_{N2}$ 641b and the second switch $S_2$ 642b may be coupled to the second current branch 632b. Respective first source/drain (S/D1) terminals of the transistors $M_{N1}$ 641a, $M_{N2}$ 641b may be connected to respective second source/drain (S/D2) terminals of the transistors $M_{P1}$ 631a, $M_{p2}$ 631b. Respective second source/drain (S/D2) terminals of the transistors $M_{N1}$ 641a, $M_{N2}$ 641b may be connected to respective switches 642a, 642b. Respective gate terminals of the transistors $M_{N1}$ 641a, $M_{N2}$ 641b may be connected to each other. Further, the respective gate terminals of the transistors $M_{N1}$ 641a, $M_{N2}$ 641b may be connected to an input terminal 650 of the CCDC 620 to receive a voltage, $V_C$, for example, generated by the gm-C filter 510 (FIG. 5A). This may mean that the voltage $V_C$ may act as a control signal for the transistors $M_{N1}$ 641a, $M_{N2}$ 641b.

The CCDC 620 may further include a delay capacitor (e.g., a small parasitic capacitor) $C_P$ 651 connected to the second current branch 632b of the current mirror circuit 630. The CCDC 620 may further include a Schmitt trigger 652 connected to the delay capacitor $C_P$ 651. An input terminal of the Schmitt trigger 652 may be connected to the delay capacitor $C_P$ 651 and to the second current branch 632b. An output terminal of the Schmitt trigger 652 may be connected to an inverter, for example, a NOT gate (or NOT logic element) 653. The circle (inverter mark) illustrated at the output of the Schmitt trigger 652 represents an inversion operation. An output terminal 654 of the CCDC 620 may be connected to the output of the NOT gate 653. An output signal, for example, in the form of an oscillator signal $V_{CLKOUT}$ 670, may be generated by the CCDC 620 and provided to the output terminal 654.

The CCDC 620 may include a feedback path 655 to feed back the oscillator signal $V_{CLKOUT}$ 670 to the switching element arrangement 640. An inverter, for example, a NOT gate (or NOT logic element) 656 and a logic arrangement (represented as a "Deadtime Logic" block) 657 may be arranged in the feedback path 655. A first input terminal 658a of the Deadtime Logic 657 may be connected to an output of the NOT gate 656 while a second input terminal 658b of the Deadtime Logic 657 may be connected to an input of the NOT gate 656. A first output terminal 659a of the Deadtime Logic 657 may be associated with the first switch $S_1$ 642a, while a second output terminal 659b of the Deadtime Logic 657 may be associated with the second switch $S_2$ 642b. For example, the first output terminal 659a of the Deadtime Logic 657 may be connected to the first switch $S_1$ 642a to provide a first control signal $\overline{V_{CLKOUT'}}$ (or "/$V_{CLKOUT'}$") 671 for controlling the first switch $S_1$ 642a, based on the signal received at the first input terminal 658a of the Deadtime Logic 657, while the second output terminal 659b of the Deadtime Logic 657 may be connected to the second switch $S_2$ 642b to provide a second control signal $V_{CLKOUT'}$ 672 for controlling the second switch $S_2$ 642b, based on the signal received at the second input terminal 658b of the Deadtime Logic 657. The first switch $S_1$ 642a and the second switch $S_2$ 642b may be alternately activated or operated to be in the closed position. The Deadtime Logic 657 may include an arrangement of one or more logic elements to generate the control signals 671, 672.

In operation, the delay capacitor $C_P$ 651 is charged or discharged by a current, $I_{DELAY}$, provided by the current mirror circuit 630 through the second current branch 632b, and which may be controlled by the control voltage $V_C$ through the transistors $M_{N1}$ 641a, $M_{N2}$ 641b. When the control voltage $V_C$ is applied to the gate (G) terminals of the transistors $M_{N1}$ 641a, $M_{N2}$ 641b to turn on the transistors $M_{N1}$ 641a, $M_{N2}$ 641b, and when the first switch $S_1$ 642a is closed (e.g., when /$V_{CLKOUT'}$ 671 is in a high state) and the second switch $S_2$ 642b is open (e.g., when $V_{CLKOUT'}$ 672 is in a low state), a current may flow through the first current branch 632a and through the first transistor $M_{N1}$ 641a and the first switch $S_1$ 642a to ground, while a similar current may flow through the second current branch 632b to the delay capacitor $C_P$ 651 to charge the delay capacitor $C_P$ 651. The charging speed is determined by the ratio of $I_{DELAY}$ to $C_P$ as shown in FIG. 6B. When the voltage of $C_P$, $V_{DELAY}$, reaches a higher threshold level (e.g., first threshold level) of the Schmitt trigger, 652, the output of the Schmitt trigger 652 is toggled to ground and $V_{CLKOUT}$ 670 goes high. Subsequently, when the first switch $S_1$ 642a is open (e.g., when /$V_{CLKOUT'}$ 671 is in a low state) and the second switch $S_2$ 642b is closed (e.g., when $V_{CLKOUT'}$ 672 is in a high state), the delay capacitor $C_P$ 651 may be discharged and the resulting current, $I_{DELAY}$, may flow through the second transistor $M_{N2}$ 641b and the second switch $S_2$ 642b to ground. When $V_{DELAY}$ is decreased to a lower threshold level (e.g., second threshold level, being lower than the first threshold level) of the Schmitt trigger, 652, the output of the Schmitt trigger 652 is toggled to high and $V_{CLKOUT}$ 670 goes low, accordingly. The resulting voltage, $V_{DELAY}$, may have a waveform 673 illustrated in FIG. 6B. In various embodiments, the Deadtime Logic 657 avoids simultaneous turn on of both switches $S_1$ 642a, $S_2$ 642b. $V_{CLKOUT'}$ 672 is an in-phase signal of $V_{CLKOUT}$ 670 with the deadtime, while /$V_{CLKOUT'}$ 671 is an out-of-phase signal of $V_{CLKOUT}$ 670 with the deadtime. These signals may be the same as $V_{CLKDB}$ 555 and $V_{CLKDA}$ 554 in FIG. 5B, respectively.

In various embodiments, the CCDC 620 is current controlled as its operation may be determined by $I_{DELAY}$. The higher the control voltage $V_C$ is supplied, the higher the current $I_{DELAY}$ may be generated. Further, $I_{DELAY}$ may control the duration of turn-on time (high state or high level) of /$V_{CLKOUT'}$ 671 and $V_{CLKOUT'}$ 672. The higher the current $I_{DELAY}$ is, the shorter the duration of turn-on time may be achieved.

Since the CCDC 620 requires no other static bias current other than the current $I_{DELAY}$, it consumes much less current than voltage comparators. In addition, the magnitude of the current $I_{DELAY}$ scales with the switching frequency of the oscillator (e.g., 500, FIG. 5A) and therefore its power consumption may be automatically optimized for a wide output frequency range.

Figure 7:
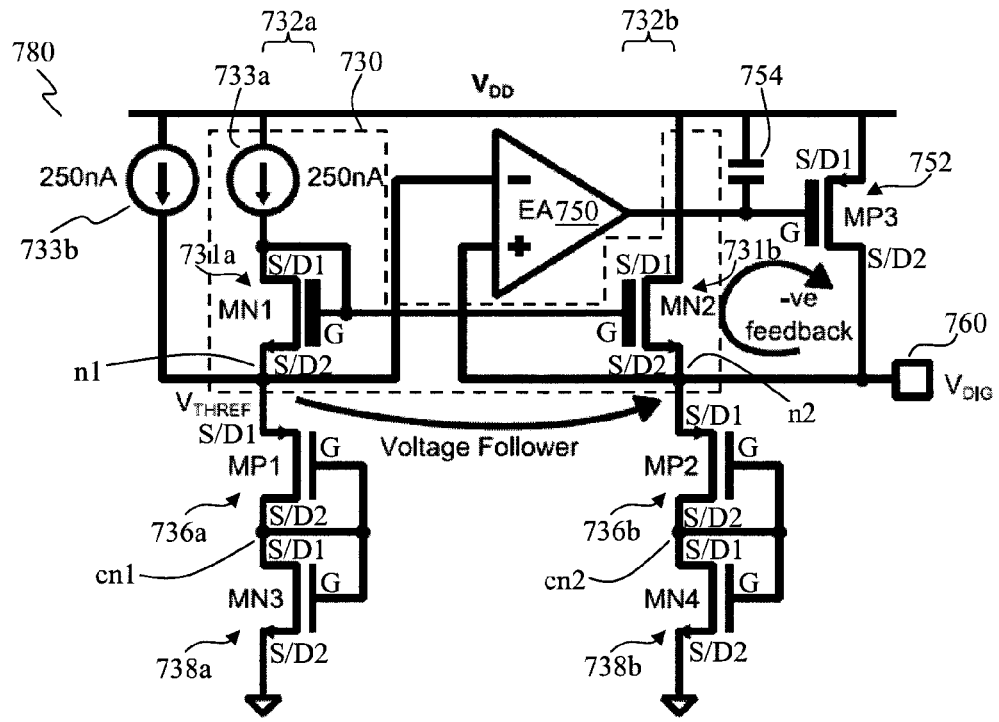
FIG. 7 shows a schematic view of a voltage generator, according to various embodiments.

In various embodiments, in order to stabilize the current consumption and the $V_C$ to $I_{DELAY}$ relationship over a wide supply voltage range, the CCDC (e.g., 520, 620) may be powered by a regulated supply voltage $V_{DIG}$. FIG. 7 shows a schematic view of a voltage generator 780, according to various embodiments, illustrating a non-limiting example of a design of a $V_{DIG}$ voltage regulator.

The voltage generator 780 may include a voltage follower circuit 730 having a pair of transistors (e.g., NMOS transistors) MN1 731*a* and MN2 731*b*. The transistor MN1 731*a* may be arranged in a first voltage branch 732*a* of the voltage follower circuit 730, while the transistor MN2 731*b* may be arranged in a second voltage branch 732*b* of the voltage follower circuit 730. The transistors MN1 731*a* and MN2 731*b* may be connected to a power supply voltage, $V_{DD}$, with a current source 733*a* connected in between the power supply voltage $V_{DD}$ and the transistor MN1 731*a*. For example, the first source/drain (S/D1) terminal of the transistor MN1 731*a* may be connected to a terminal of the current source 733*a*, with the other terminal of the current source 733*a* connected to the power supply voltage, $V_{DD}$, while the first source/drain (S/D1) terminal of the transistor MN2 731*b* may be connected directly to the power supply voltage, $V_{DD}$. Respective gate (G) terminals of the transistors MN1 731*a* and MN2 731*b* may be connected to each other. The gate (G) terminal of the transistor MN1 731*a* may be connected to the first source/drain (S/D1) terminal of the transistor MN1 731*a*.

The voltage generator 780 may further include another current source 733*b* connected in parallel to the current source 733*a* and the transistor MN1 731*a*, and connected between the power supply voltage, $V_{DD}$ and the second source/drain (S/D2) terminal of the transistor MN1 731*a* at a first node n1. Each of the current sources 733*a*, 733*b* may supply a current of about 250 nA.

The voltage generator 780 may further include a first transistor (e.g., a PMOS transistor) MP1 736*a* and a second transistor (e.g., an NMOS transistor) MN3 738*a* connected in series with each other. The transistors MP1 736*a*, MN3 738*a* may be connected to and between the first node n1 and ground. The first source/drain (S/D1) terminal of the transistor MP1 736*a* may be connected to the first node n1, the second source/drain (S/D2) terminal of the transistor MP1 736*a* and the first source/drain (S/D1) terminal of the transistor MN3 738*a* may be connected together at a connection node cn1, and the second source/drain (S/D2) terminal of the transistor MN3 738*a* may be connected to ground. Respective gate (G) terminals of the transistors MP1 736*a*, MN3 738*a* may be connected to each other and further connected to the connection node cn1 between the transistors MP1 736*a*, MN3 738*a*.

The voltage generator 780 may further include a third transistor (e.g., a PMOS transistor) MP2 736*b* and a fourth transistor (e.g., an NMOS transistor) MN4 738*b* connected in series with each other. The transistors MP2 736*b*, MN4 738*b* may be connected to and between a second node n2 connected to the second source/drain (S/D2) terminal of the transistor MN2 731*b*, and ground. The first source/drain (S/D1) terminal of the transistor MP2 736*b* may be connected to the second node n2, the second source/drain (S/D2) terminal of the transistor MP2 736*b* and the first source/drain (S/D1) terminal of the transistor MN4 738*b* may be connected together at a connection node cn2, and the second source/drain (S/D2) terminal of the transistor MN4 738*b* may be connected to ground. Respective gate (G) terminals of the transistors MP2 736*b*, MN4 738*b* may be connected to each other and further connected to the connection node cn2 between the transistors MP2 736*b*, MN4 738*b*.

The voltage generator 780 may further include an error amplifier (EA) 750 having a first input (e.g., an inverting (−) input) connected to the first node n1, and a second input (e.g., a non-inverting (+) input) connected to the second node n2. The voltage generator 780 may further include a feedback transistor (e.g., a PMOS transistor) MP3 752 connected between the power supply voltage $V_{DD}$ and the output 760 of the voltage generator 780. The first source/drain (S/D1) terminal of the feedback transistor 752 may be connected to the power supply voltage $V_{DD}$, the second source/drain (S/D2) terminal of the feedback transistor 752 may be connected to the output 760, while the gate (G) terminal of the feedback transistor 752 may be connected to the output of the EA 750. A capacitor 754 may be connected between the gate (G) terminal of the feedback transistor 752 and the power supply voltage $V_{DD}$.

In various embodiments, $V_{DIG}$, provided at the output 760 of the voltage generator 780, may be regulated to a voltage level that equals to the sum of the absolute threshold voltages of a PMOS transistor and a NMOS transistor, e.g., the transistors MP1 736*a*, MN3 738*a*. The voltage generator (or regulator) 780 requires no external decoupling capacitor for stability. The $V_{DIG}$ voltage regulation may be achieved by two mechanisms:

1) $V_{THREF}$, at the first node n1 and approximately equal to the voltage sum of the threshold voltages of the transistor MP1 736*a* and the transistor MN3 738*a*, may be buffered to $V_{DIG}$ at the output 760 through the NMOS voltage follower 730 constructed by the transistors MN1 731*a*, MN2 731*a*. The impedance at the $V_{DIG}$ output 760 may be kept to be low.

2) Negative feedback loop formed by the error amplifier 750 and the feedback transistor MP3 752 may improve the accuracy of the NMOS voltage follower circuit 730 further for a wider load current range. For example, consider a large voltage drop in $V_{DIG}$ due to high transient current pulling out of the regulator 780. Because the voltage of the non-inverting input of the error amplifier 750 is smaller than that of the inverting input, its output voltage may be decreased. Accordingly, the gate-source voltage ($V_{GS}$) in the feedback transistor MP3 752 may also be decreased so that the current supplied from $V_{DD}$ via the feedback transistor MP3 752 may be increased. As such, $V_{DIG}$ may be recovered shortly by this negative feedback loop.

In various embodiments, the $V_{DIG}$ generator 780 may consume about 1 µA quiescent current from $V_{DD}$. The voltage $V_{DIG}$ may power also all the digital logic circuits (e.g., including the "Logic and Pulse Gen" circuit 542) that are essential for generating all the clock signals to the switches (e.g., 505*a*, 505*b*, 506*a*, 506*b*, 507*a*, 507*b*, FIG. 5A).

Figure 8:
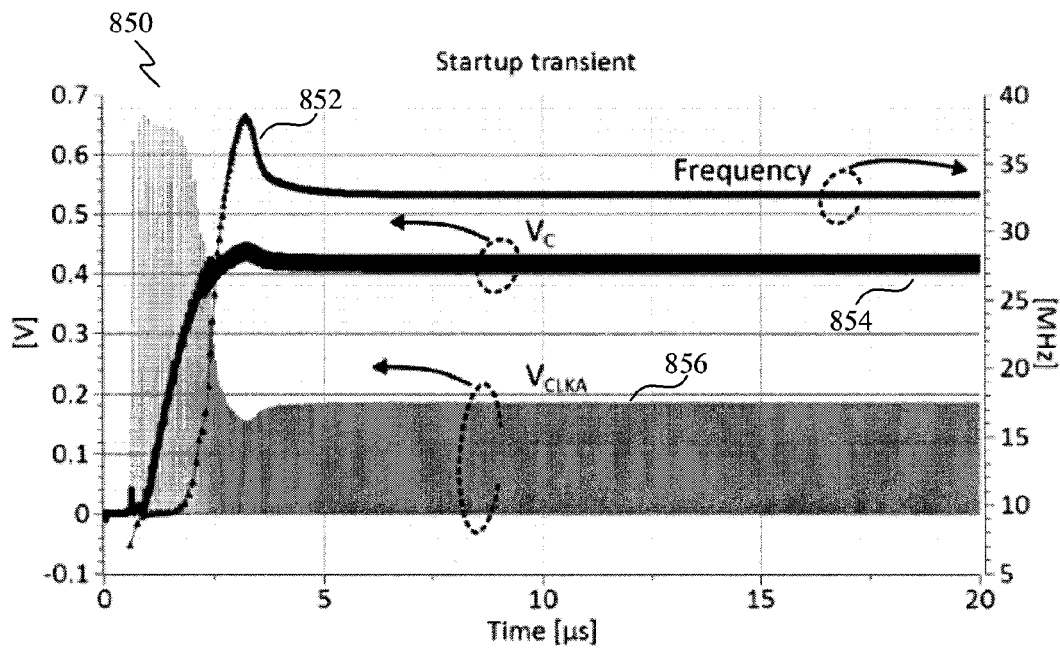
FIG. 8 shows a plot of startup transient simulation results of the relaxation oscillator of various embodiments.

FIG. 8 shows a plot 850 of startup transient simulation result of the relaxation oscillator of various embodiments, illustrating the startup waveform of the oscillator programmed to approximately 32.8 MHz. Plot 850 shows results 852 for frequency, results 854 for $V_C$ (output voltage of the gm-C filter, e.g., 510, FIG. 5A) and results 856 for $V_{CLKA}$ (e.g., voltage applied to switch 505*a* for enabling charging of the capacitor $C_T$ 504*a*, FIG. 5A). $V_{REF}$ and CVS may be designed to be about 200 mV. The magnitudes of $V_{RA}$ (e.g., corresponding to the capacitor $C_T$ 504*a*, FIG. 5A) and $V_{RB}$ (e.g., corresponding to the capacitor $C_T$ 504*b*, FIG. 5A) take about 5 µs to reach the steady state, programmed by $V_C$. As shown by the results 852, the clock frequency settles at approximately 32.75 MHz.

Figure 9:
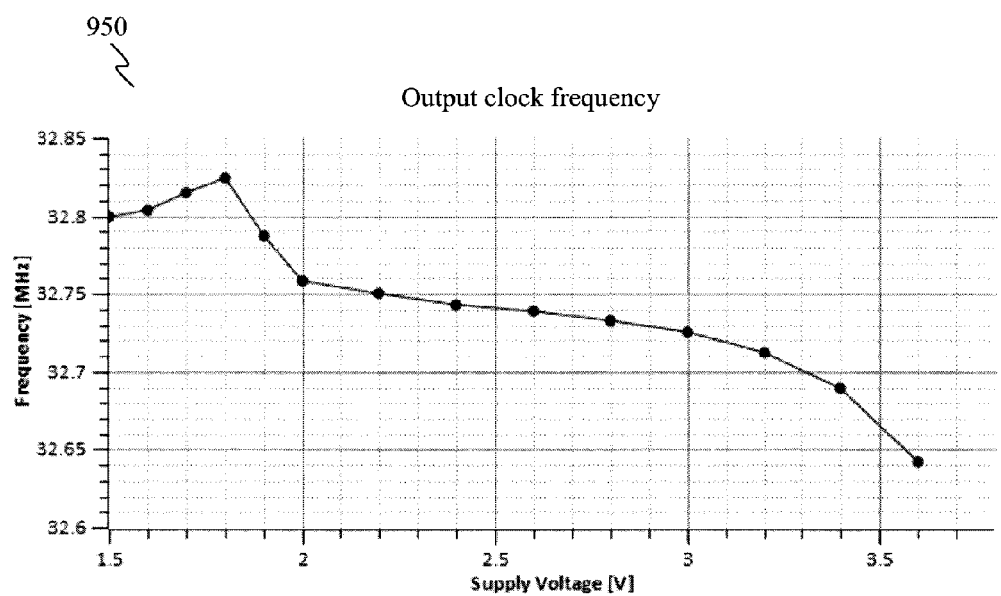
FIG. 9 shows a plot of measurement results of the oscillator frequency versus the supply voltage, according to various embodiments.

FIG. 9 shows a plot 950 of measurement results of the oscillator frequency versus the supply voltage, according to various embodiments, illustrating the relationship between the oscillator switching frequency and the supply voltage for the oscillator. It may be observed from plot 850 that for a supply voltage in a range from about 2 V to about 3V, the total frequency variation is approximately <±0.05%. The total frequency variation may increase slightly to approximately <±0.28% for a wider supply voltage range of about 2 V to about 3.6 V.

Table 1 summarises the performance of the relaxation oscillator of various embodiments. The design of various embodiments may achieve the best figure of merit (FOM) for power and low supply sensitivity at the same time as compared to prior art designs. The chip area is the smallest as compared to the oscillators of prior art developed in a 0.18 μm CMOS process and it may be comparable to oscillators of prior art in a 65 nm process.

TABLE 1

Performance summary

| | This work (Includes on-chip $V_{DIG}$ regulator) |
|---|---|
| Technology | 0.18 μm |
| Area | 0.0132 mm² |
| Frequency | 32.75 MHz |
| Supply Voltage | 1.5 V to 3.6 V |
| Freq. variation with VDD | ±0.13%/V |
| Power consumption | 16.6 μW |
| FOM (μW/MHz) | 0.51 |

As described above, various embodiments may provide low-power consumption at high output frequency, and/or a small-area oscillator because of the elimination of high-speed high accuracy comparator and the use of a gm-C filter instead of an active-RC filter, and/or the power consumption of the current controlled delay cell (CCDC) may adapt to the change of the oscillator frequency automatically, which is suitable for the design of a relaxation oscillator with programmable frequency (or an output frequency programmable relaxation oscillator).

In various embodiments, a low power current controlled delay cell (CCDC) may be employed as the switching period control element, which may lower the power consumption of the oscillator.

The oscillator of various embodiments does not require any voltage comparator (which outputs voltage) and therefore power consumption may be reduced.

The oscillator of various embodiments may work efficiently at a frequency band of about 50 MHz or lower (i.e., ≤50 MHz) for different applications.

The oscillator of various embodiments may provide a measured result for current consumption, $I_Q=11$ μA for generating the target clock (e.g., oscillator signal). The oscillator of various embodiments may provide a switching frequency $F_{SW}=32$ MHz. The oscillator of various embodiments may occupy a chip area of about 0.013 mm² @ 0.18 μm CMOS technology.

However, there may be challenges in that the noise performance of the design of various embodiments may not be optimised. The noise from the gm-C filter may not be optimized as it is optimized for low-power and small area instead of for power management applications, where the noise may lower the quality factor of the output clock signal.

Nevertheless, a chopper stabilized gm-C filter may be employed in the design of various embodiments for better noise performance at the expense of slightly larger chip area and power.

Further, a finite startup time may be required for the output clock signal to be stabilized by the feedback loop which is similar to prior art oscillators with feedback regulation, where a typical relaxation oscillator without feedback loop may start-up almost instantly.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An oscillator comprising:
a switched capacitor circuit arrangement configured to generate a predetermined voltage;
a transconductance-capacitor filter configured to receive the predetermined voltage and a reference voltage, and to generate an output filter voltage based on a differential result between the predetermined voltage and the reference voltage, wherein a value of the output filter voltage is variable in response to the differential result; and
a period control circuit arrangement configured to receive the output filter voltage, and further configured to generate an oscillator signal, wherein a period of the oscillator signal is variable in response to the value of the output filter voltage,
wherein the period control circuit arrangement comprises:
a current mirror circuit having a first current branch and a second current branch;
a switching element arrangement electrically coupled to the current mirror circuit;
a delay capacitor connected to the second current branch of the current mirror circuit,
wherein the switching element arrangement is configured to control current flow through the current mirror circuit for charging and discharging of the delay capacitor; and
a Schmitt trigger connected to the delay capacitor, the Schmitt trigger configured to generate the oscillator signal based on a voltage state of the delay capacitor in response to the charging and the discharging of the delay capacitor, and
wherein the oscillator is configured to control the switched capacitor circuit arrangement based on the oscillator signal to generate the predetermined voltage to be matched to the reference voltage.

2. The oscillator as claimed in claim 1, further comprising a feedback path connected to the period control circuit arrangement and the switched capacitor circuit arrangement, wherein the oscillator is configured to feed back, through the feedback path, the oscillator signal for controlling the switched capacitor circuit arrangement to generate the predetermined voltage to be matched to the reference voltage.

3. The oscillator as claimed in claim 2, further comprising a pulse generating circuit in the feedback path, wherein the pulse generating circuit is configured to receive the oscillator signal that is fed back and further configured to generate at least one control signal based on the oscillator signal for controlling the switched capacitor circuit arrangement to generate the predetermined voltage to be matched to the reference voltage.

4. The oscillator as claimed in claim 1, wherein the switched capacitor circuit arrangement comprises two capacitor circuit branches configured to alternately generate the predetermined voltage to be received by the transconductance-capacitor filter, wherein each capacitor circuit branch comprises a timing capacitor for generating the predetermined voltage.

5. The oscillator as claimed in claim 4, wherein each capacitor circuit branch further comprises:
   a first switch and a second switch, wherein the timing capacitor is connected in between the first switch and the second switch,
   wherein the first switch is adapted for controlling charging of the timing capacitor for generating the predetermined voltage, and
   wherein the second switch is adapted for controlling supply of the predetermined voltage that is generated to the transconductance-capacitor filter.

6. The oscillator as claimed in claim 5, wherein each capacitor circuit branch further comprises a third switch adapted for controlling discharging of the timing capacitor.

7. The oscillator as claimed in claim 1, wherein the switched capacitor circuit arrangement comprises a storing capacitor to store the predetermined voltage to be received by the transconductance-capacitor filter.

8. The oscillator as claimed in claim 1, further comprising a current source configured to supply a current to the switched capacitor circuit arrangement for generating the predetermined voltage.

9. The oscillator as claimed in claim 1, wherein the transconductance-capacitor filter comprises:
   a transconductance amplifier configured to receive the predetermined voltage and the reference voltage and further configured to provide an output filter current based on the differential result between the predetermined voltage and the reference voltage; and
   an output capacitor connected to an output of the transconductance amplifier, the output capacitor configured to receive the output filter current and to generate the output filter voltage from the output filter current received by the output capacitor.

10. The oscillator as claimed in claim 1, wherein the switching element arrangement comprises:
    a first transistor and a first switch connected in series, and coupled to the first current branch of the current mirror circuit; and
    a second transistor and a second switch connected in series, and coupled to the second current branch of the current mirror circuit,
    wherein respective gate terminals of the first transistor and the second transistor are connected to each other to receive the output filter voltage, and
    wherein the period control circuit arrangement is configured to generate respective control signals based on the oscillator signal to alternately activate the first switch and the second switch.

11. The oscillator as claimed in claim 10, wherein the period control circuit arrangement further comprises a logic arrangement configured to generate the respective control signals.

12. The oscillator as claimed in claim 1, further comprising a voltage generator configured to provide a regulated supply voltage to the period control circuit arrangement.

13. The oscillator as claimed in claim 12, wherein the voltage generator comprises:
    a voltage follower circuit connected to a power supply voltage, the voltage follower circuit having a first voltage branch and a second voltage branch;
    a first transistor and a second transistor connected in series with each other and further connected between a first node of the first voltage branch and ground, wherein respective gate terminals of the first transistor and the second transistor are connected to each other and further connected to a connection node between the first transistor and the second transistor;
    a third transistor and a fourth transistor connected in series with each other and further connected between a second node of the second voltage branch and ground, wherein respective gate terminals of the third transistor and the fourth transistor are connected to each other and further connected to a connection node between the third transistor and the fourth transistor,
    wherein the voltage generator is configured to generate a threshold voltage at the first node, and to supply the threshold voltage to the second node through the voltage follower circuit, the threshold voltage being at least substantially equal to a voltage sum of the absolute threshold voltages of the first transistor and the second transistor, and
    wherein the voltage generator is configured to provide the threshold voltage as the regulated supply voltage at an output of the voltage generator.

14. The oscillator as claimed in claim 13, wherein the voltage generator further comprises:
    an error amplifier having a first input connected to the first node, and a second input connected to the second node; and
    a feedback transistor connected between the power supply voltage and the output of the voltage generator, wherein a gate terminal of the feedback transistor is connected to an output of the error amplifier.

15. The oscillator as claimed in claim 1, further comprising a reference circuit comprising a current source, the reference circuit configured to generate the reference voltage based on a current supplied by the current source.

16. The oscillator as claimed in claim 1, wherein the oscillator comprises a relaxation oscillation.

* * * * *